United States Patent
Oh et al.

(10) Patent No.: US 11,094,382 B2
(45) Date of Patent: Aug. 17, 2021

(54) SEMICONDUCTOR MEMORY DEVICE INCLUDING PAGE BUFFERS

(71) Applicant: SK hynix Inc., Icheon-si (KR)

(72) Inventors: Sung Lae Oh, Cheongju-si (KR); Dong Hyuk Kim, Seoul (KR); Tae Sung Park, Icheon-si (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/885,192

(22) Filed: May 27, 2020

(65) Prior Publication Data

US 2021/0217479 A1 Jul. 15, 2021

(30) Foreign Application Priority Data

Jan. 14, 2020 (KR) .................. 10-2020-0004682

(51) Int. Cl.
| | |
|---|---|
| *G11C 5/06* | (2006.01) |
| *G11C 16/24* | (2006.01) |
| *G11C 16/04* | (2006.01) |
| *G11C 16/26* | (2006.01) |
| *H01L 27/11582* | (2017.01) |
| *H01L 27/11556* | (2017.01) |
| *H01L 27/11565* | (2017.01) |
| *H01L 27/11519* | (2017.01) |

(52) U.S. Cl.
CPC .......... *G11C 16/24* (2013.01); *G11C 16/0483* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC ....... G11C 5/063; G11C 7/18; G11C 11/4097; G11C 5/025; G11C 5/04
USPC ......................................................... 365/63
See application file for complete search history.

(56) References Cited

U.S. PATENT DOCUMENTS

| | | | |
|---|---|---|---|
| 7,679,108 B2 | 3/2010 | Matsunaga et al. | |
| 10,141,326 B1* | 11/2018 | Oh | ............... H01L 27/11573 |
| 2016/0233233 A1* | 8/2016 | Kim | ............... H01L 27/11556 |

FOREIGN PATENT DOCUMENTS

| | | |
|---|---|---|
| JP | 2006-261324 A | 9/2006 |
| KR | 10-2019-0041397 A | 4/2019 |

* cited by examiner

*Primary Examiner* — Son T Dinh

(57) ABSTRACT

A semiconductor memory device includes a plurality of page buffers defined in active regions of a substrate; and a plurality of wiring lines disposed over the page buffers, and coupled to the page buffers through contacts. The plurality of wiring lines may include contact portions which are coupled with the contacts, respectively. The plurality of wiring lines may be configured into a bent shape such that the contact portions are offset toward center lines of the active regions.

20 Claims, 15 Drawing Sheets

SEMICONDUCTOR MEMORY DEVICE INCLUDING PAGE BUFFERS

CROSS-REFERENCE TO RELATED APPLICATION

The present application claims priority under 35 U.S.C. § 119(a) to Korean Patent Application No. 10-2020-0004682 filed in the Korean Intellectual Property Office on Jan. 14, 2020, which is incorporated herein by reference in its entirety.

BACKGROUND

1. Technical Field

Various embodiments generally relate to a semiconductor memory device, and particularly, to a semiconductor memory device including page buffers.

2. Related Art

A volatile memory device has high write and read speeds, but may lose data stored therein if power supply is interrupted. A nonvolatile memory device has relatively low write and read speeds, but may retain data stored therein even though power supply is interrupted. Therefore, in order to store data which should be retained regardless of power supply, a nonvolatile memory device is often used.

NAND flash memory devices are widely used in data storage devices with nonvolatile memory. The NAND flash memory device may perform operations necessary to read and output data stored in memory cells using a plurality of page buffers.

SUMMARY

Various embodiments are directed to a semiconductor memory device capable of suppressing a coupling failure between a page buffer and a contact.

In an embodiment, a semiconductor memory device may include: a plurality of page buffers defined in a plurality of active regions of a substrate; and a plurality of wiring lines disposed over the plurality of page buffers, and coupled to the plurality of page buffers through a plurality of contacts. The plurality of wiring lines may include a plurality of contact portions that are coupled to the plurality of contacts. The plurality of wiring lines may be bent such that the plurality of contact portions are offset toward center lines of the active regions.

In an embodiment, a semiconductor memory device may include: a plurality of transistors defined in active regions of a substrate, and configuring a plurality of page buffers; and a plurality of wiring lines disposed over the plurality of transistors, and coupled to the plurality of transistors through a plurality of contacts. Each of the plurality of wiring lines may include at least two straight portions and a tilted portion that connects the straight portions. Straight portions of adjacent wiring lines may be spaced apart from each other with a first interval, and tilted portions of adjacent wiring lines may be spaced apart from each other with a second interval smaller than the first interval. Each of the plurality of contacts may be coupled to one of the at least two straight portions of each of the plurality of wiring lines. The straight portion that is coupled to the contact may be disposed closer to a center line of each active region than the other straight portion that is not coupled with the contact.

In an embodiment, a semiconductor memory device may include: a memory structure including a memory cell array that is defined on a first substrate; and a logic structure including a logic circuit that is defined on a second substrate. The logic circuit may include: a plurality of page buffers defined in active regions of the second substrate; and a plurality of wiring lines disposed over the plurality of page buffers, and coupled to the plurality of page buffers through a plurality of contacts. Each of the plurality of wiring lines may include contact portions that are coupled with the plurality of contacts. The plurality of wiring lines may be bent such that the contact portions are offset toward center lines of the active regions.

DETAILED DESCRIPTION

Figure 1:
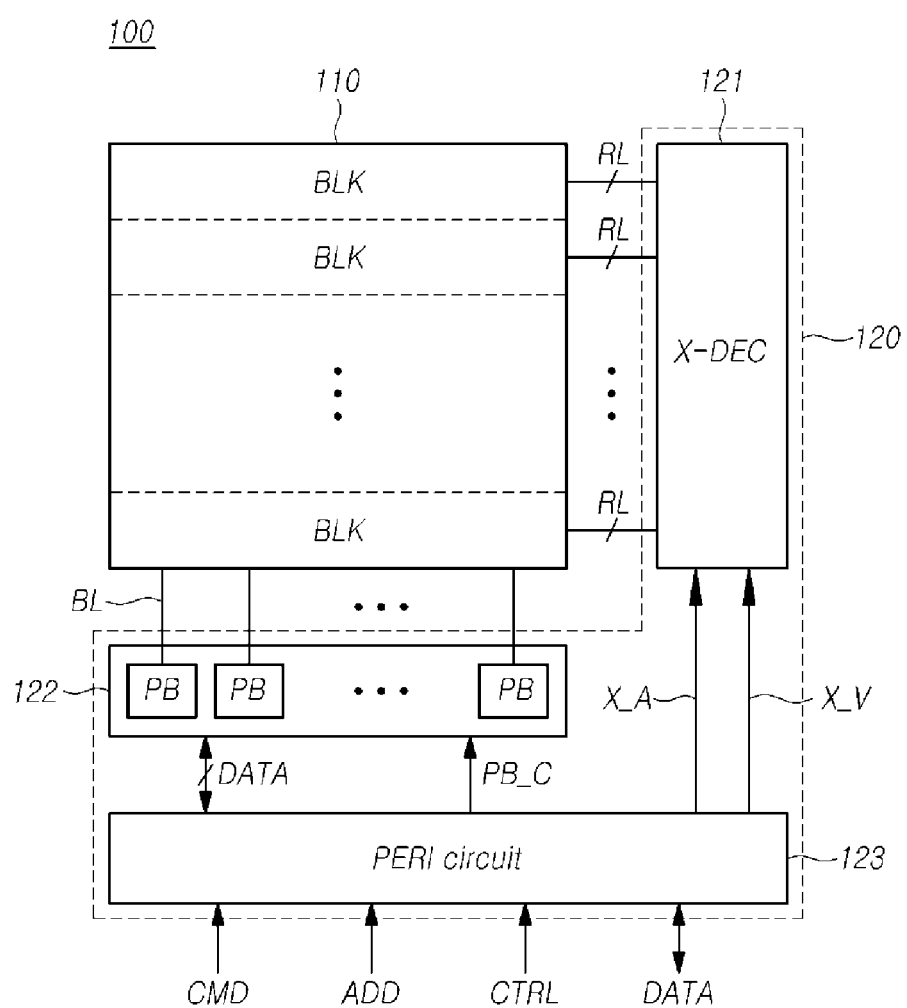
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

In the accompanying drawings, two directions that are parallel to the top surface of a substrate or a source plate and intersect with each other are defined as a first direction FD and a second direction SD, respectively, and a direction that vertically projects from the top surface of the substrate or the source plate is defined as a third direction TD. For example, the first direction FD may correspond to the extending direction of word lines and the arrangement direction of bit lines, and the second direction SD may correspond to the extending direction of the bit lines and the arrangement direction of the word lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or may be a nonvolatile memory cell. While embodiments herein describe a semiconductor memory device that is a vertical NAND flash device, it is to be understood that the technical spirit of the disclosure is not limited thereto.

The memory cell array 110 may be coupled to the row decoder 121 through row lines RL. The row lines RL may include at least one drain select line, a plurality of word lines and at least one source select line.

The row decoder 121 may select any one among the memory blocks BLK included in the memory cell array 110 in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The memory cell array 110 may be coupled to the page buffer circuit 122 through bit lines BL. The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123.

The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

The row decoder 121, the page buffer circuit 122 and the peripheral circuit 123 may configure a logic circuit 120. The logic circuit 120 may be disposed under the memory cell array 110. This structure may be defined as a PUC (peri under cell) structure. The memory cell array 110 and the logic circuit 120 may be fabricated on different wafers, and then, may be bonded and coupled into one. This structure may be defined as a POC (peri over cell) structure. The semiconductor memory device 100, in accordance with an embodiment of the disclosure, may include either a PUC or a POC structure.

Figure 2:
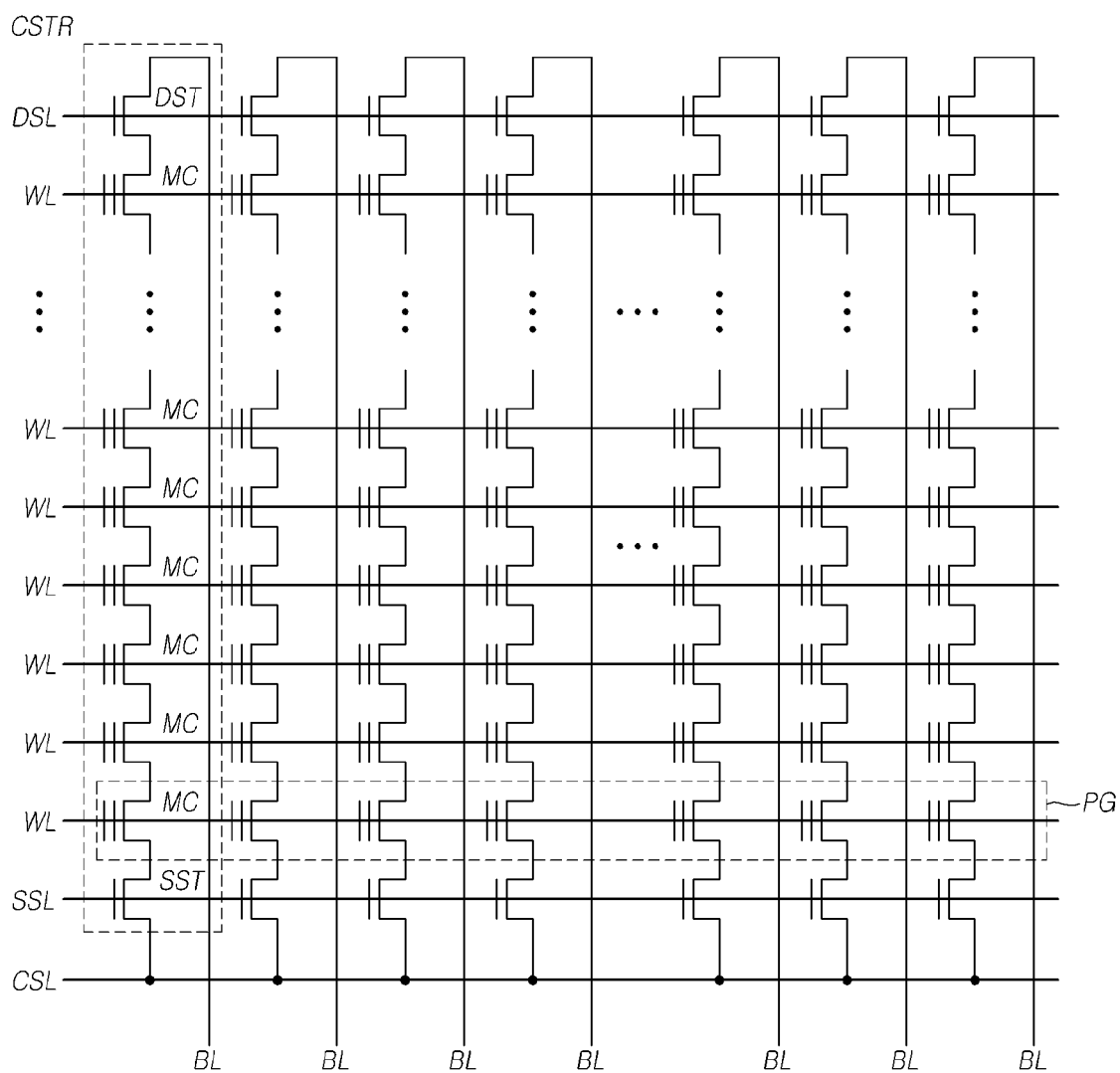
FIG. 2 is an equivalent circuit diagram illustrating a representation of one of memory blocks illustrated in FIG. 1.

FIG. 2 is an equivalent circuit diagram illustrating an example of one of the memory blocks BLK illustrated in FIG. 1.

Referring to FIG. 2, a memory block BLK may include a plurality of cell strings CSTR, corresponding to a plurality of bit lines BL, and a common source line CSL.

Each of the cell strings CSTR may be coupled between a corresponding bit line BL and the common source line CSL. Each of the cell strings CSTR may include a source select transistor SST, which is coupled to the common source line CSL, a drain select transistor DST, which is coupled to the bit line BL, and a plurality of memory cells MC, which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed or arranged in a direction perpendicular to the bit lines BL. The source select line SSL, the word lines WL and the drain select line DSL may form a three-dimensional structure by being stacked on a surface of a substrate in a vertical direction.

The memory cells MC included in the memory block BLK may be divided into physical page units or logical page units. For example, memory cells MC that share a word line WL and are coupled to different cell strings CSTR may configure one physical page PG. Such a page may be a basic unit of a read operation.

Although it is illustrated in FIG. 2 that one drain select transistor DST and one source select transistor SST are provided in each of the cell strings CSTR, it is to be noted that at least two drain select transistors or at least two source select transistors may be provided in each of the cell strings CSTR.

Figure 3:
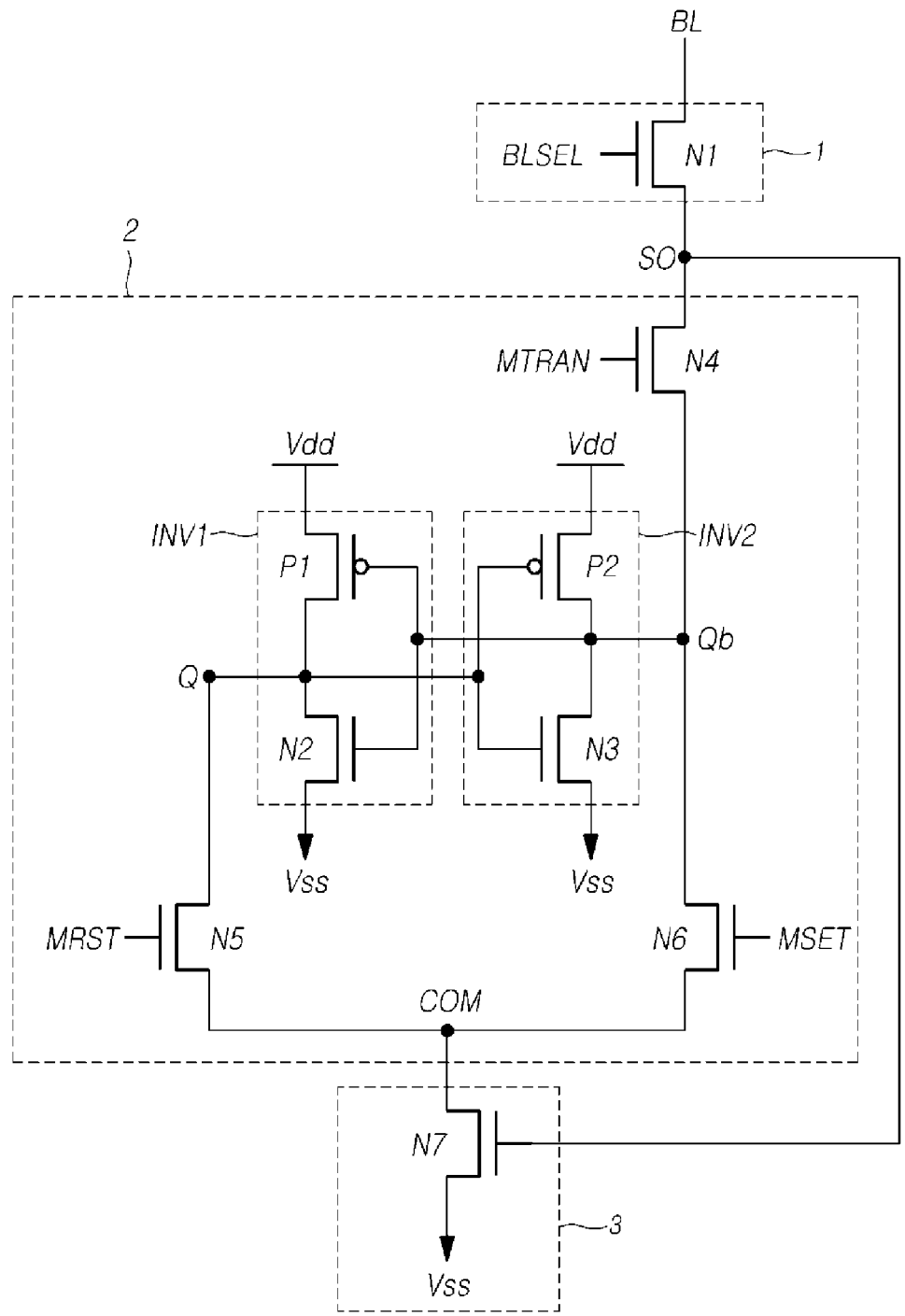
FIG. 3 is a circuit diagram illustrating a representation of one of page buffers illustrated in FIG. 1.

FIG. 3 is a circuit diagram illustrating a representation of one of the page buffers PB illustrated in FIG. 1.

Referring to FIG. 3, the page buffer PB may include a first sensing circuit 1, a latch 2, and a second sensing circuit 3.

The first sensing circuit 1 may include a first NMOS transistor N1, which is coupled between a bit line BL and a sensing node SO. The first NMOS transistor N1 may couple the bit line BL and the sensing node SO in response to a bit line select signal BLSEL.

The latch 2 may include first and second PMOS transistors P1 and P2 and second to sixth NMOS transistors N2 to N6. The first PMOS transistor P1 and the second NMOS transistor N2, which have gates that are coupled in common, may be coupled in series between a power supply voltage Vdd and a ground voltage Vss, and thereby configure an inverter INV1. The second PMOS transistor P2 and the third NMOS transistor N3, which have gates that are coupled in common, may be coupled in series between the power supply voltage Vdd and the ground voltage Vss, and thereby configure an inverter INV2. The inverter INV1 and the inverter INV2 may be coupled in reverse parallel between a non-inverting node Q and an inverting node Qb to form a latch structure. The non-inverting node Q may store and retain non-inverted data of the latch 2, and the inverting node Qb may store and retain inverted data of the latch 2.

The fourth NMOS transistor N4 is coupled between the sensing node SO and the inverting node Qb, and in response to a trans signal MTRAN changes the potential of the sensing node SO depending on a data value stored in the inverting node Qb. The fifth NMOS transistor N5 is coupled between the non-inverting node Q and a common node COM, and may couple the non-inverting node Q and the common node COM in response to a first control signal MRST. The sixth NMOS transistor N6 is coupled between the inverting node Qb and the common node COM, and may couple the inverting node Qb and the common node COM in response to a second control signal MSET.

The second sensing circuit 3 may include a seventh NMOS transistor N7. The seventh NMOS transistor N7 is coupled between the common node COM and the ground voltage Vss, and may be turned on, depending on the potential of the sensing node SO. to transfer the ground voltage Vss to the common node COM.

Figure 4:
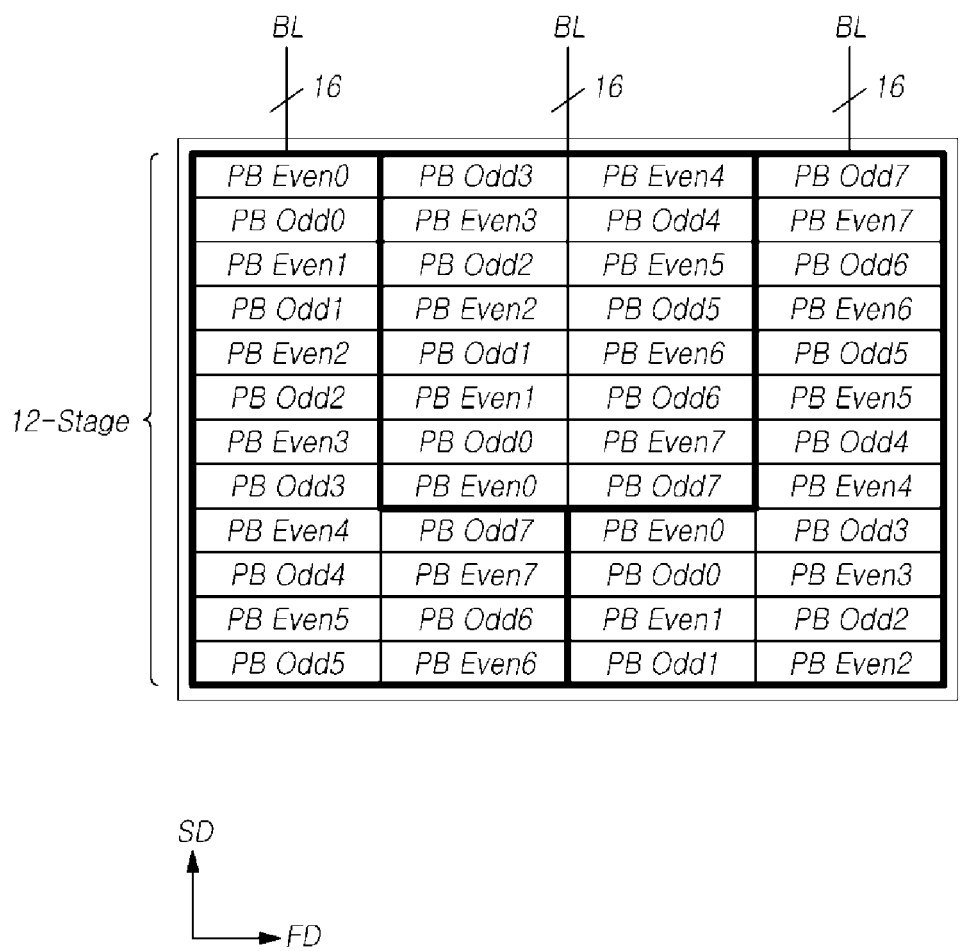
FIG. 4 is a layout diagram illustrating a representation of a disposition of page buffers in accordance with an embodiment of the disclosure.

FIG. 4 is a layout diagram illustrating a representation of a disposition of page buffers in accordance with an embodiment of the disclosure.

Referring to FIG. 4, a page buffer circuit 130 may include a plurality of page buffers PB that are coupled to a plurality of bit lines BL. Due to a reduction in the pitch of the bit lines BL attributable to process miniaturization, the page buffers PB may be two-dimensionally arranged in a first direction FD and a second direction SD. In this case, as the number of stages in the second direction SD increases, the size of the semiconductor memory device 100 may increase, thereby increasing manufacturing costs. The number of stages of the page buffer circuit 130 may be understood as the number of page buffers PB which are arranged in the second direction SD (e.g., a column direction), which is also the direction in which bit lines BL extend.

In order to reduce the size of the semiconductor memory device 100, a method of reducing the number of stages of the page buffer circuit 130 is used. For instance, the page buffer circuit 130 may be configured in such a manner that the number of stages is changed from sixteen (16) in the conventional art to twelve (12). FIG. 4 illustrates an example in which the page buffers PB configuring the page buffer circuit 130 are disposed in the form of a matrix that has twelve (12) stages and four columns, but it is to be noted that embodiments contemplated by the disclosure are not limited thereto.

In FIG. 4, forty-eight (48) page buffers PB in the page buffer circuit 130 may configure three page buffer input/output units (regions bordered by the bold lines). Each page buffer input/output unit may include eight even page buffers (PB Even0 to PB Even7) and eight odd page buffers (PB Odd0 to PB Odd7). Although FIG. 4 illustrates a case in which the even page buffers PB Even0 to PB Even7 and the odd page buffers PB Odd0 to PB Odd7 are alternately disposed in the second direction SD, it is to be noted that the disclosure is not limited thereto and other arrangements are possible.

Data stored in the eight even page buffers PB Even0 to PB Even7, included in each page buffer input/output unit, may be simultaneously outputted in parallel at the time of data output. Data stored in the eight odd page buffers PB Odd0 to PB Odd7 included in each page buffer input/output unit may be simultaneously outputted in parallel at the time of data output. In an embodiment, when the page buffer circuit 130 is configured with twelve (12) stages and four columns, each page buffer input/output unit may be disposed over two columns.

In order to reduce the size of the semiconductor memory device 100, a method of reducing the number of stages of the page buffer circuit 130 and at the same time reducing the width of a unit region defined by a width of a page buffer PB in the second direction SD is used. If the width of the unit region is reduced, then the width in the second direction SD of transistors configuring the page buffer PB should be reduced, and the pitch in the second direction SD of wiring lines coupled to the transistors configuring the page buffer PB through contacts should also be reduced. In this case, the overlap margin between active regions where the transistors configuring the page buffer PB are positioned and the contacts may become too tight. As a consequence, an open failure in which a contact is not coupled to an active region may occur, or, as the contact area between a contact and an active region decreases, the possibility of the occurrence of a failure, in which contact resistance becomes abnormally high, may increase.

If the interval between adjacent contacts is narrow, the limit performance of equipment used in a contact forming process (for example, the limit resolution of exposure equipment) influences the possibility of a failure during the contact forming process.

By replacing the equipment used in the contact forming process with ultra-expensive and high-performance equipment, the above-mentioned failure may be suppressed or limited, but the cost of the equipment increases the price of the products, rendering them less competitive. Embodiments of the present disclosure may suggest a semiconductor memory device capable of suppressing the above-mentioned failure without the need for ultra-expensive equipment.

Figure 5:
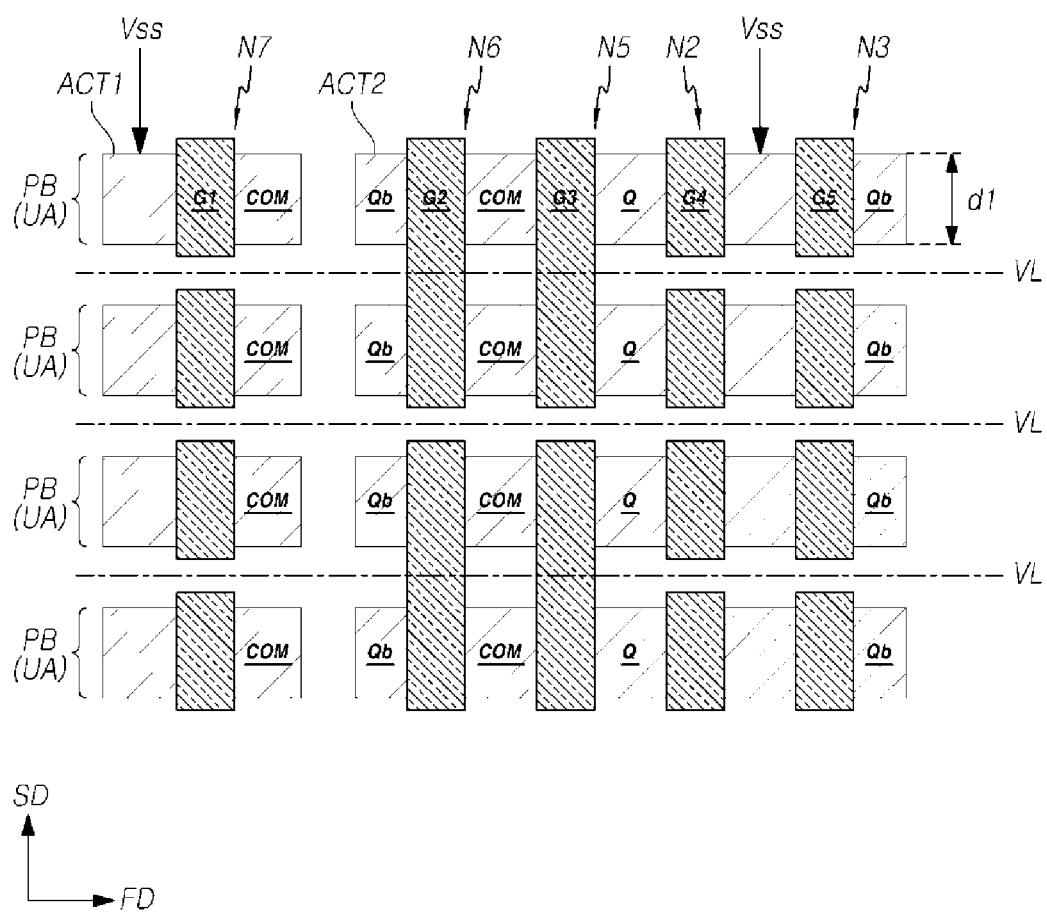
FIG. 5 is a layout diagram illustrating a representation of transistors configuring the page buffers of FIG. 4.
Figure 6:
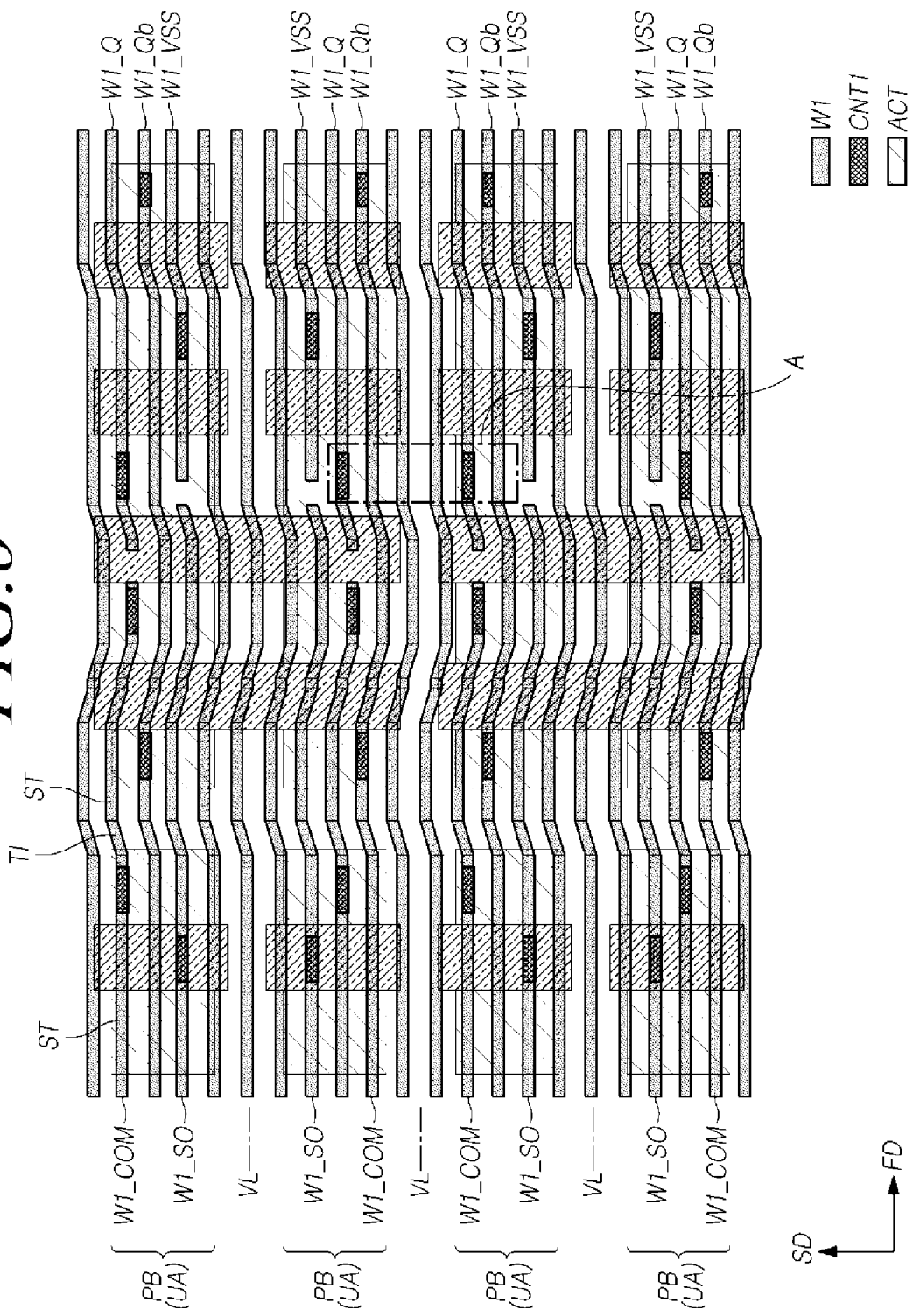
FIG. 6 is a layout diagram illustrating a representation of wiring lines and contacts disposed over the transistors of FIG. 5.

FIG. 5 is a layout diagram illustrating a representation of transistors configuring the page buffers of FIG. 4, and FIG. 6 is a layout diagram illustrating a representation of wiring lines and contacts disposed over the transistors of FIG. 5.

Referring to FIG. 5, a plurality of page buffers PB are arranged in the second direction SD (i.e., the column direction), which is also the direction in which bit lines BL extend. FIG. 5 illustrates four page buffers PB, which are arranged in a line in the second direction SD, among the page buffers PB configuring the page buffer circuit 130 of FIG. 4.

Active regions ACT may be disposed in each unit region UA, which is defined by the width of the page buffer PB in the second direction SD. A unit region UA may also be defined as a region which is defined by the width of the active regions ACT in the second direction SD. For example, a width d1 of the active regions ACT in the second direction SD may be substantially the same as the width of the unit region UA.

The active regions ACT may include a first active region ACT1 and a second active region ACT2, which are disposed in a line in the first direction FD. A plurality of NMOS transistors N2, N3, and N5 to N7, which configure page buffer PB, may be defined in the first active region ACT1 and the second active region ACT2.

In detail, a first gate line G1, which traverses the first active region ACT1 in the second direction SD, may be defined on a substrate (not illustrated), on which the first and second active regions ACT1 and ACT2 are also defined. The first gate line G1, and a source region and a drain region that are defined in the first active region ACT1 on opposite sides of the first gate line G1, may configure the seventh NMOS transistor N7 of the page buffer PB. The drain region of the seventh NMOS transistor N7 may configure the common node COM, and the source region of the seventh NMOS transistor N7 may be coupled to the ground voltage Vss.

Second to fifth gate lines G2 to G5, which traverse the second active region ACT2 in the second direction SD, may be defined on the substrate. The second gate line G2, and a source region and a drain region that are defined in the second active region ACT2 on opposite sides of the second gate line G2, may configure the sixth NMOS transistor N6 of the page buffer PB. The third gate line G3, and a source region and a drain region that are defined in the second active region ACT2 on opposite sides of the third gate line G3, may configure the fifth NMOS transistor N5 of the page buffer PB. The fourth gate line G4, and a source region and a drain region that are defined in the second active region ACT2 on opposite sides of the fourth gate line G4, may configure the second NMOS transistor N2 of the page buffer PB. The fifth gate line G5, and a source region and a drain region that are defined in the second active region ACT2 on opposite sides of the fifth gate line G5, may configure the third NMOS transistor N3 of the page buffer PB.

The drain region of the sixth NMOS transistor N6 may configure the inverting node Qb. The sixth NMOS transistor N6 and the fifth NMOS transistor N5 may share a source region. The common source region of the sixth NMOS transistor N6 and the fifth NMOS transistor N5 may configure a common node COM.

The fifth NMOS transistor N5 and the second NMOS transistor N2 may share a drain region. The common drain region of the fifth NMOS transistor N5 and the second NMOS transistor N2 may configure a non-inverting node Q. The second NMOS transistor N2 and the third NMOS transistor N3 may share a source region. The common source region of the second NMOS transistor N2 and the third NMOS transistor N3 may be coupled to the ground voltage Vss. The drain region of the third NMOS transistor N3 may configure an inverting node Qb.

The second NMOS transistors N2 included in the page buffers PB may be disposed in a column in the second direction SD. The third NMOS transistors N3 included in the page buffers PB may also be disposed in a column in the second direction SD. The fifth NMOS transistors N5 and the sixth NMOS transistors N6 may also be disposed in the same manner as the second NMOS transistors N2 and the third NMOS transistors N3. Accordingly, the non-inverting nodes Q of the page buffers PB that are arranged in the second direction SD may be disposed in a column in the second direction SD, and the inverting nodes Qb of the page buffers PB that are arranged in the second direction SD may be disposed in a column in the second direction SD.

Referring to FIGS. 5 and 6, a plurality of wiring lines W1 are defined in a wiring layer over the NMOS transistors N2, N3, and N5 to N7, which configure the page buffers PB. The wiring lines W1 may be coupled to the NMOS transistors N2, N3, and N5 to N7 through contacts CNT1. The wiring lines W1 may include wiring lines W1_Q, W1_Qb, W1_COM, W1_SO and W1_VSS. The wiring line W1_Q represents a non-inverting data line that is coupled to the non-inverting node Q, the wiring line W1_Qb represents an inverting data line that is coupled to the inverting node Qb, the wiring line W1_VSS represents a ground line that transfers ground voltage Vss, the wiring line W1_COM represents a common line that is coupled to the common node COM, and the wiring line W1_SO represents a sensing line that is coupled to the sensing node SO.

The reference symbol VL denotes a virtual line which that passes between a pair of page buffers PB adjacent to each other in the second direction SD. The common lines W1_COM that are coupled to the pair of page buffers PB adjacent to each other in the second direction SD may be symmetrically disposed with respect to the virtual line VL. The sensing lines W1_SO that are coupled to the pair of page buffers PB adjacent to each other in the second direction SD may also be symmetrically disposed with respect to the virtual line VL.

On the other hand, the non-inverting data lines W1_Q that are coupled to the pair of page buffers PB adjacent to each other in the second direction SD are not symmetrically disposed with respect to the virtual line VL. Similarly, the inverting data lines W1_Qb that are coupled to the pair of page buffers PB adjacent to each other in the second direction SD are also not symmetrically disposed with respect to the virtual line VL. The order of the non-inverting data line W1_Q and the inverting data line W1_Qb may be the same in all the page buffers PB. For example, in each page buffer PB, the inverting data line W1_Qb and the non-inverting data line W1_Q may be disposed in an ascending order in the second direction SD. Accordingly, the non-inverting data lines W1_Q and the inverting data lines W1_Qb may be alternately disposed or arranged in the second direction SD.

Figure 7:
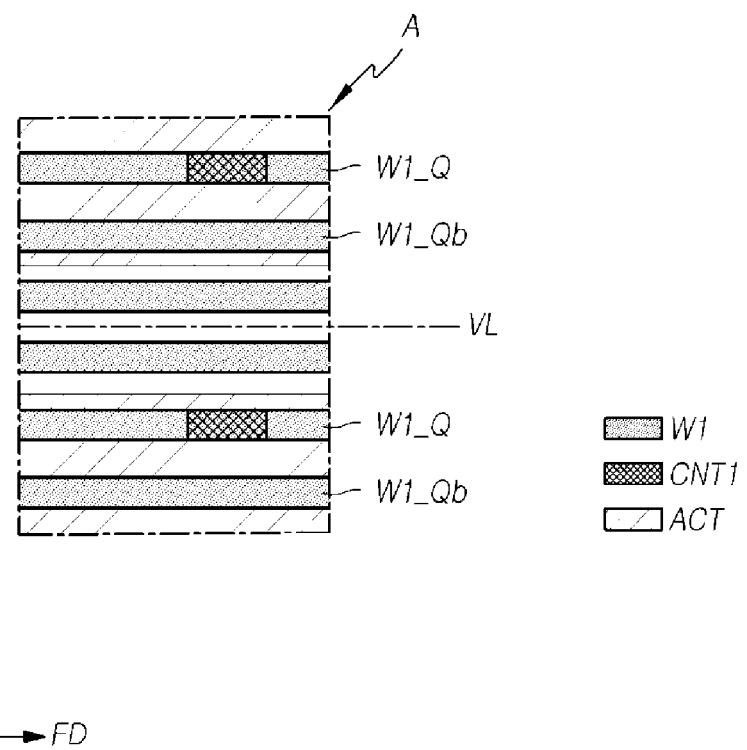
FIG. 7 is an enlarged layout diagram of part A of FIG. 6.
Figure 8:
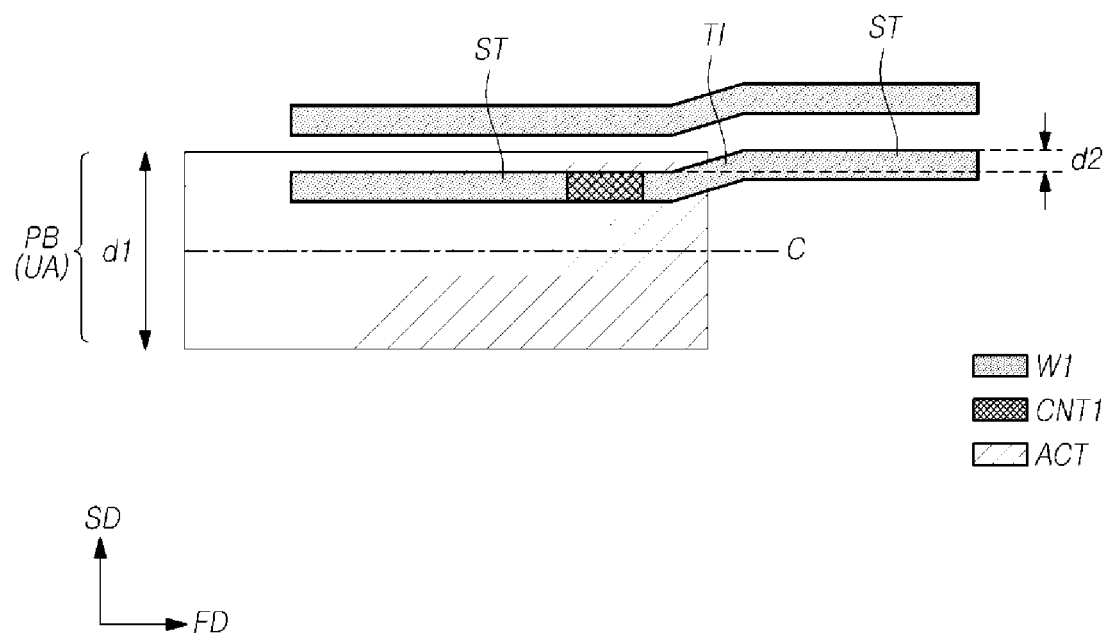
FIG. 8 is a layout diagram illustrating a representation of a tilted portion of a wiring line in accordance with an embodiment of the disclosure.

FIG. 7 is an enlarged layout diagram of part A of FIG. 6, and FIG. 8 is a layout diagram illustrating a representation of a tilted portion of a wiring line in accordance with an embodiment of the disclosure.

Referring to FIG. 7, three wiring lines W1 may be disposed between a pair of non-inverting data lines W1_Q adjacent to each other in the second direction SD. The pair of non-inverting data lines W1_Q adjacent to each other in the second direction SD may be spaced apart from each other by a width required for the disposition of the three wiring lines W1.

As described above with reference to FIG. 5, since the non-inverting nodes Q of the page buffers PB arranged in the second direction SD are disposed in a column in the second direction SD, the contacts CNT1 that are coupled to the non-inverting nodes Q of the page buffers PB adjacent to each other in the second direction SD may be disposed in a column in the second direction SD. When the interval between the non-inverting data lines W1_Q is narrow, the interval between the contacts CNT1 coupled to the non-inverting data lines W1_Q becomes narrow, thereby increasing the likelihood of a failure in the contact forming process.

In an embodiment, by configuring all of the page buffers PB with the same disposition order of the non-inverting data lines W1_Q and the inverting data lines W1_Qb, non-inverting data lines W1_Q are not symmetrical about virtual line VL, and the interval between the non-inverting data lines W1_Q is wider as a result, which contributes to suppression of failures that may occur in the process of forming the contacts CNT1.

Referring to FIGS. 6 and 8, each of the wiring lines W1 may include straight portions ST and a tilted portion TI that connects the straight portions ST. The straight portions ST may extend in the first direction FD. The tilted portion TI may have the shape of a line which extends in an oblique direction that intersects with the first direction FD and the second direction SD. The contact CNT1 may be coupled to one of the straight portions ST of the wiring line W1. The part of straight portion ST of the wiring line W1 that is coupled with the contact CNT1 may be defined as a contact portion.

The wiring lines W1 may be configured into a bent shape in such a manner that, out of the straight portions ST of each wiring line W1, the straight portion ST that is coupled with the contact CNT1 is offset in the second direction SD toward a center line C of the unit region UA, compared to the straight portion ST which is not coupled with the contact CNT1. The reference symbol d2 of FIG. 8 denotes the amount of the offset.

Figure 9:
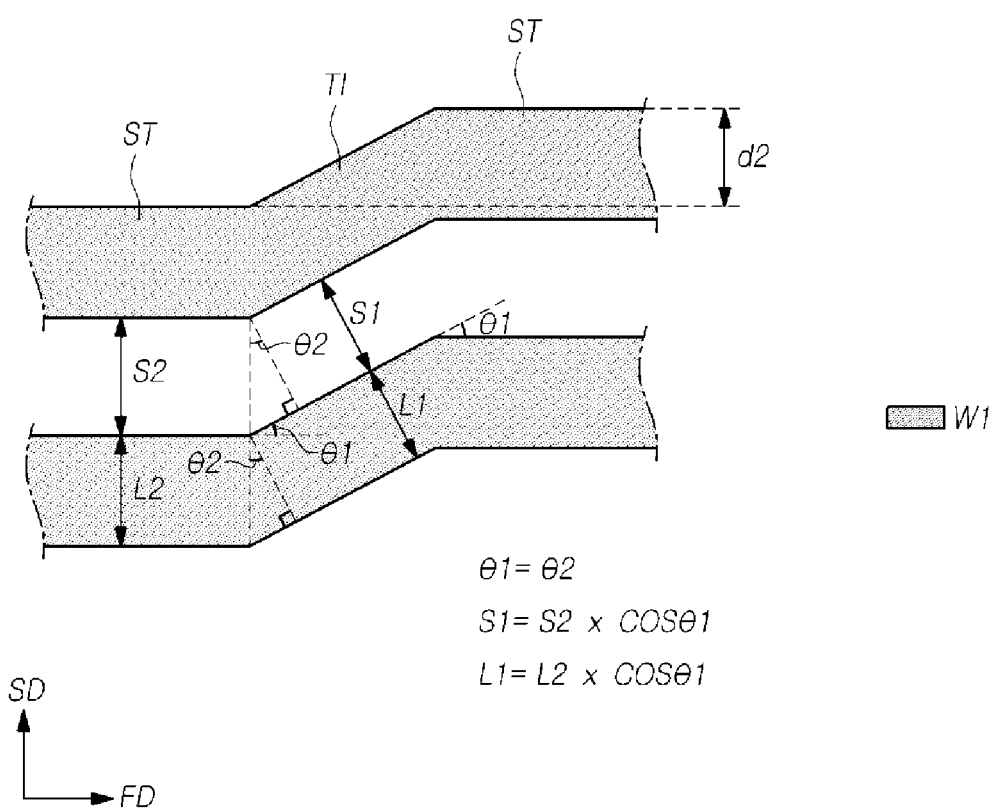
FIG. 9 is a representation of a diagram to assist in the explanation of the relationship between a tilted portion and a straight portion of a wiring line in accordance with an embodiment of the disclosure.
Figure 10:
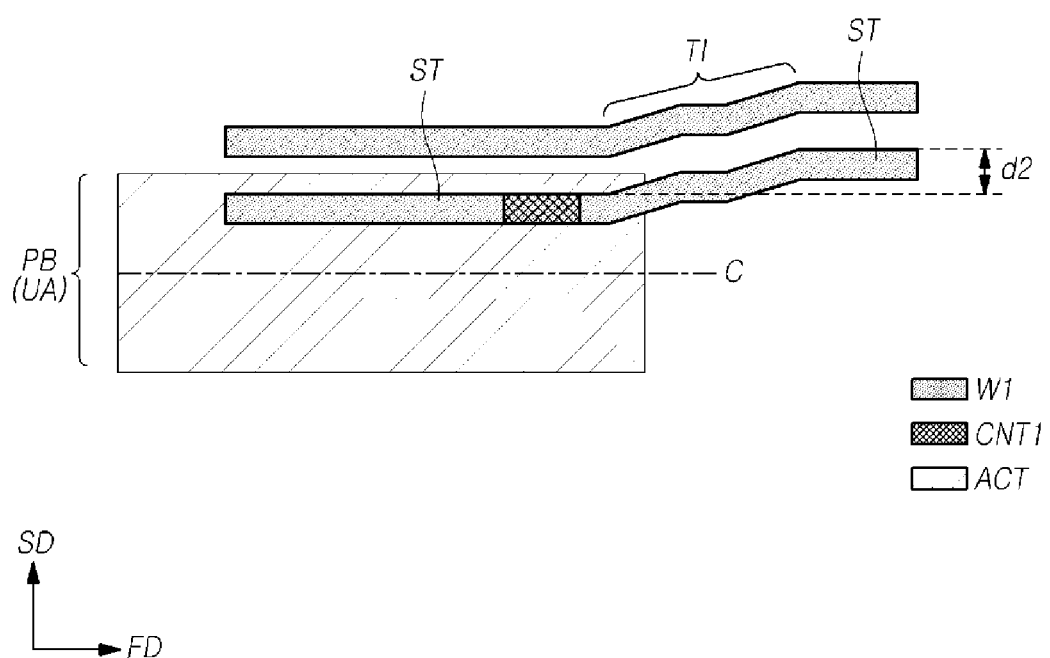
FIG. 10 is a layout diagram illustrating a representation of a tilted portion of a wiring line in accordance with an embodiment of the disclosure.

FIG. 9 is a representation of a diagram to assist in the explanation of the relationship between a tilted portion and a straight portion of a wiring line in accordance with an embodiment of the disclosure, and FIG. 10 is a layout diagram illustrating a representation of the structure of a tilted portion of a wiring line in accordance with an embodiment of the disclosure.

Referring to FIG. 9, the angle formed by the tilted portion TI and the straight portion ST may be a first angle $\theta 1$. The angle formed by a normal orthogonal to the tilted portion TI and a normal orthogonal to the straight portion ST may be a second angle $\theta 2$, and the second angle $\theta 2$ is the same as the first angle $\theta 1$. A line width L1 of the tilted portion TI may be defined as the product of a line width L2 of the straight portion ST and COS $\theta 1$ as expressed in Equation 1 below. A space width S1 between adjacent tilted portions TI may be defined as the product of a space width S2 between adjacent straight portions ST and COS $\theta 1$ as expressed in Equation 2 below.

$$L1 = L2 \times \text{COS } \theta 1 \qquad [\text{Equation 1}]$$

$$S1 = S2 \times \text{COS } \theta 1 \qquad [\text{Equation 2}]$$

Since $\theta 1$ is greater than 0 degree and less than 90 degrees, COS $\theta 1$ will have a value less than 1. Therefore, the line width L1 of the tilted portion TI will have a value smaller than the line width L2 of the straight portion ST (see Equation 1). Also, the space width S1 between adjacent tilted portions TI may have a value smaller than the space width S2 between adjacent straight portions ST (see Equation 2).

The pitch of the tilted portions TI of the wiring lines W1 may be defined as the sum of L1 and S1. The pitch of the straight portions ST of the wiring lines W1 may be defined as the sum of L2 and S2. The pitch of the tilted portions TI will have a value smaller than the pitch of the straight portions ST.

Increasing the offset d2 of the wiring line W1 will increase the value of $\theta 1$, and thus, the line width L1 of the tilted portion TI and the space width S1 between adjacent tilted portions TI will decrease. Conversely, decreasing the offset d2 of the wiring line W1 will decrease the value of $\theta 1$, and thus, the line width L1 of the tilted portion TI and the space width S1 between adjacent tilted portions TI will increase. The line width L1 of the tilted portion TI and the space width S1 between adjacent tilted portions TI may have sizes that depend on the offset d2.

If the tilted portion TI is configured in the shape of a line extending in an oblique direction, then the line width L1 of the tilted portion TI and the space width S1 between adjacent tilted portions TI will decrease when the offset d2 is increased. Consequently, the difference between L1 and L2 and the difference between S1 and S2 will increase. As a result, the resistance of the wiring line W1 will increase due to a decrease in the width of the tilted portion TI, and the difficulty in a wiring line forming process will rise in order to manufacture a wiring line W1 whose width and space are not constant.

Referring to FIG. 10, in disclosed embodiments, the tilted portion TI may have a structure in which a plurality of lines extending in an oblique direction and inclined with respect to the straight portion ST are connected in multiple, stepped stages by a shorter straight line connector. By spreading out the tilted portions over a greater distance in the first direction, it is possible to increase the offset d2 without making θ1 large enough to affect wire line forming processes.

Hereafter, some other benefits of embodiments of the disclosure will be described with reference to FIG. 11.

Figure 11:
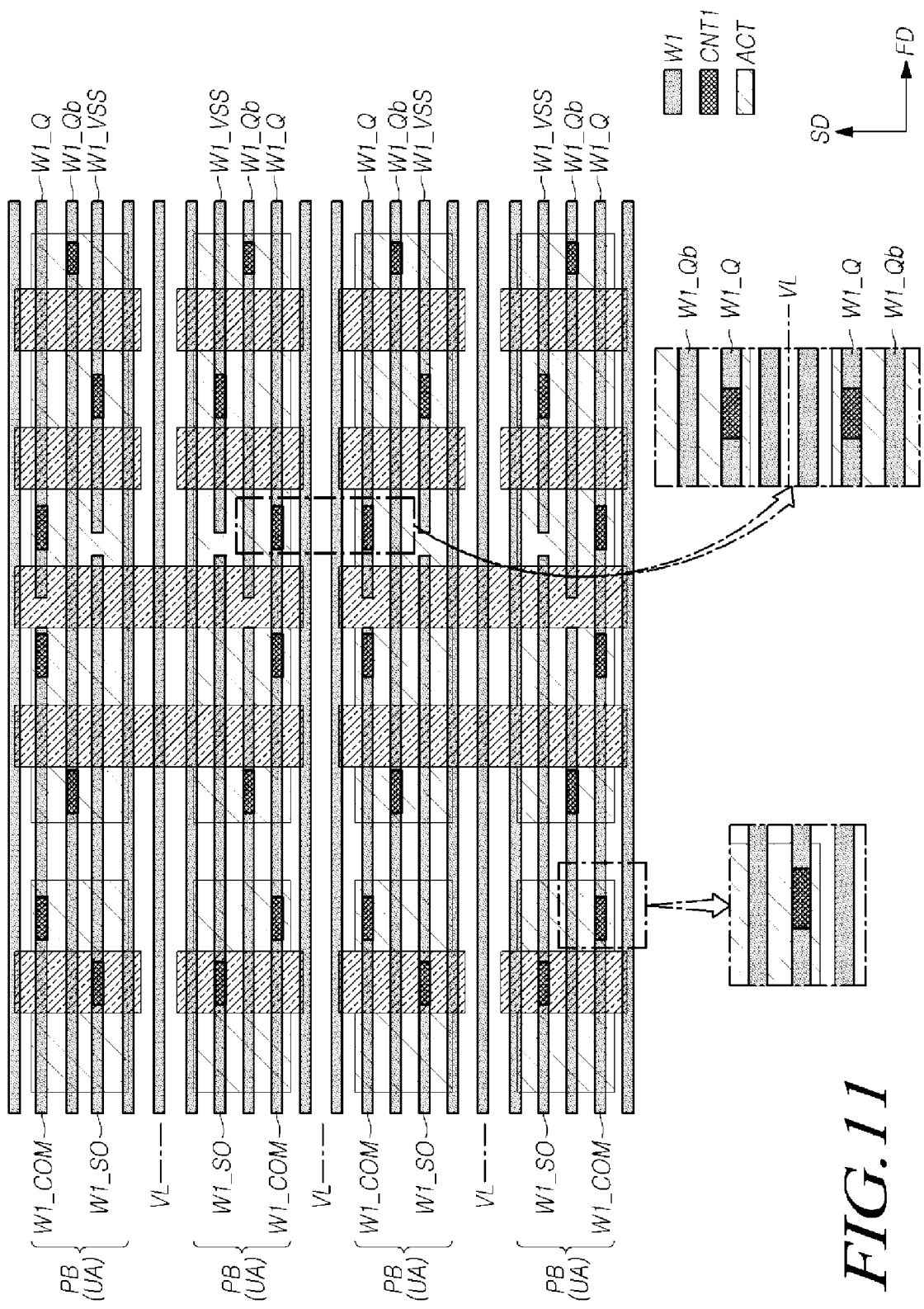
FIG. 11 is a top view illustrating a representation of a semiconductor memory device related to the disclosure.

FIG. 11 is a top view illustrating a representation of a semiconductor memory device related to the disclosure.

Referring to FIG. 11, non-inverting data lines W1_Q that are coupled to two page buffers PB adjacent to each other in the second direction SD are symmetrically disposed with respect to a virtual line VL. Inverting data lines W1_Qb that are coupled to the two page buffers PB adjacent to each other in the second direction SD are also symmetrically disposed with respect to the virtual line VL.

Two wiring lines W1 are disposed between the non-inverting data lines W1_Q that are coupled to the two page buffers PB adjacent to each other in the second direction SD. The pair of non-inverting data lines W1_Q adjacent to each other in the second direction SD are spaced apart from each other by a width required for the disposition of the two wiring lines W1. In this case, since the interval between the non-inverting data lines W1_Q adjacent to each other in the second direction SD is insufficient, there is a high probability of the occurrence of a failure during a process for forming the contacts CNT1, which couple the non-inverting data lines W1_Q and the page buffers PB.

As described above with reference to FIGS. 6 and 7, in the embodiments of the disclosure, the disposition order of the non-inverting data line W1_Q and the inverting data line W1_Qb is configured to be the same in all the page buffers PB. Due to this fact, the number of wiring lines W1 that are disposed between a pair of non-inverting data lines W1_Q adjacent to each other in the second direction SD may be increased to 3, and the interval between the pair of non-inverting data lines W1_Q adjacent to each other in the second direction SD may be increased to a size corresponding to a width required for the disposition of three wiring lines W1. According to embodiments of the disclosure, the interval between the non-inverting data lines W1_Q may be widened, and thus, a failure likely to occur during the process for forming the contacts CNT1 may be suppressed.

Referring again to FIG. 11, wiring lines W1 extend straight in the first direction FD. In this case, a wiring line W1 disposed at the edge of the unit region UA defined by the page buffer PB may be disposed substantially close to the boundary of the active region ACT (as illustrated in the smaller detail of FIG. 11). Due to this fact, an overlap margin between the contact CNT1 coupled to the wiring line W1 positioned at the edge of the active region ACT may become insufficient, and thus the occurrence of a poor coupling between the contact CNT1 and the active region ACT may increase.

In contrast, in embodiments described above with reference to FIGS. 6 to 10, the part (the contact portion) of the wiring line W1 coupled to the page buffer PB is configured to be offset toward the center line of the unit region UA in the second direction SD such that contact CNT1 may be disposed away from the edge and towards the centerline of the active region ACT. Accordingly, the interval or distance between the contact portion of the wiring line W1 coupled to the contact CNT1 and the boundary of the active region ACT may be widened or increased. By increasing or securing an overlap margin between the contact CNT1 coupled to the wiring line W1 and disposed at or near the edge of the unit region UA and the active region ACT of the page buffer PB, a poor coupling between the contact CNT1 and the active region ACT of the page buffer PB can be prevented or suppressed.

Figure 12:
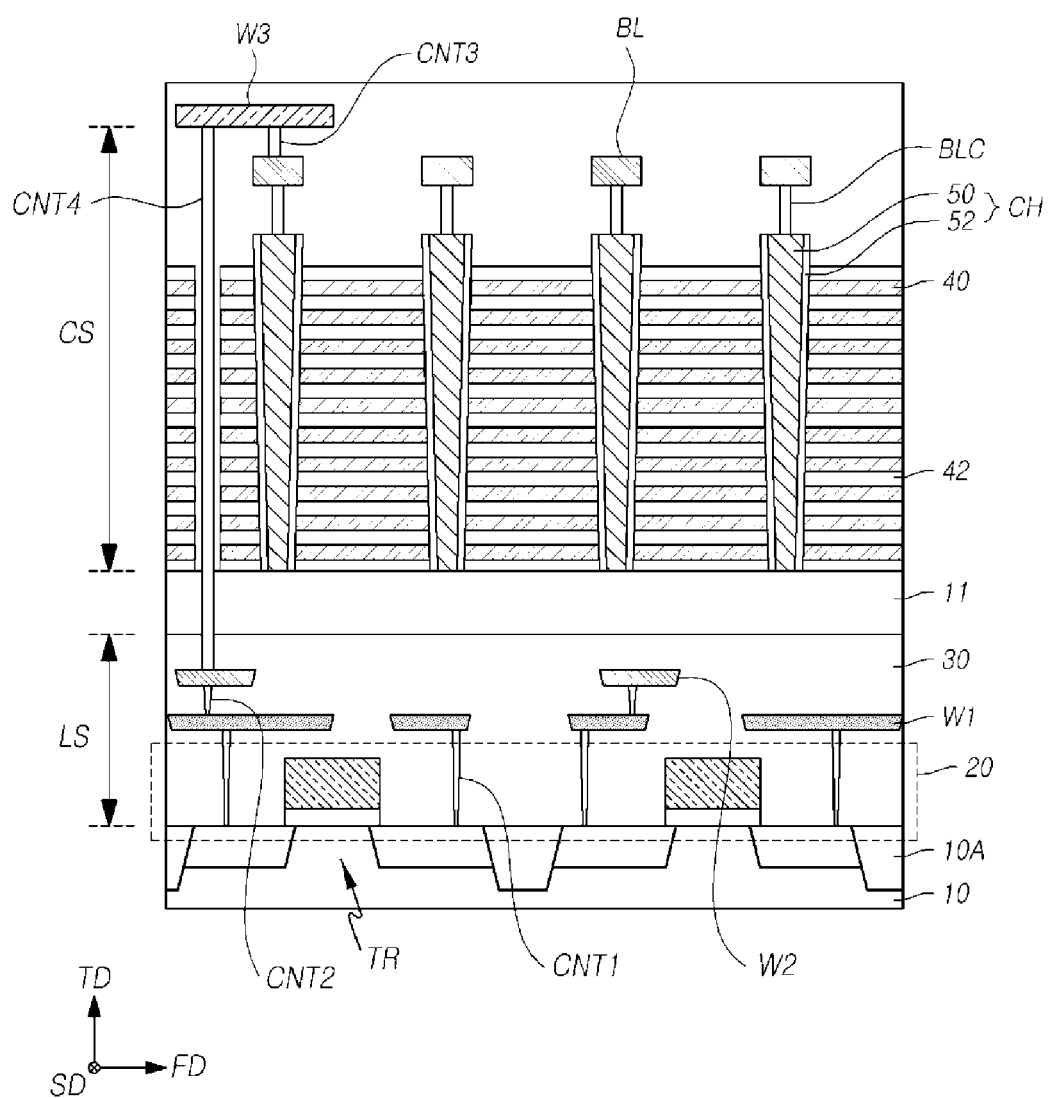
FIGS. 12 and 13 are cross-sectional views illustrating examples of semiconductor memory devices in accordance with embodiments of the disclosure.

FIG. 12 is a cross-sectional view illustrating an example of a part of a semiconductor memory device in accordance with an embodiment of the disclosure.

Referring to FIG. 12, the semiconductor memory device may have a PUC (peri under cell) structure. A logic structure LS may be disposed under a memory structure CS.

The logic structure LS may be disposed on a first substrate 10, and the memory structure CS may be disposed on a second substrate 11. The first substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The second substrate 11 may be configured by a polysilicon layer. Since the second substrate 11 should be formed on the logic structure LS, unlike the first substrate 10 which may use a monocrystalline silicon layer, the second substrate 11 may be configured by a polysilicon layer.

The logic structure LS may include a logic circuit 20. The logic circuit 20 may include transistors TR which are disposed on active regions of the first substrate 10. Active regions are defined by an isolation layer 10A. While not illustrated, the logic circuit 20 may further include capacitors, inductors, and so forth. The logic circuit 20 may include a row decoder 121, a page buffer circuit 122 and a peripheral circuit 123 described above with reference to FIG. 1. FIG. 12 illustrates a case where bit lines BL, which are defined in the memory structure CS, are coupled to the page buffer circuit (not illustrated) which is defined in the logic structure LS.

A dielectric layer 30 may be defined on the first substrate 10 to cover the logic circuit 20. The dielectric layer 30 may include silicon oxide, for example, HDP (high density plasma) oxide or TEOS (tetra-ethyl-ortho-silicate) oxide. A plurality of wiring lines W1 and W2 may be defined in the dielectric layer 30. The wiring lines W1 and W2 may include wiring lines W1 which are defined in a first wiring layer over the logic circuit 20 and wiring lines W2 which are defined in a second wiring layer over the first wiring layer. The wiring lines W1 may be coupled to the logic circuit 20 through contacts CNT1. The wiring lines W1 may include the wiring lines described above with reference to FIGS. 6 to 9. The wiring lines W2 may be coupled to the wiring lines W1 through contacts CNT2.

The memory structure CS may include a plurality of vertical channels CH, which are disposed on the second substrate 11, and a plurality of electrode layers 40 and a plurality of interlayer dielectric layers 42 that are alternately stacked along the vertical channels CH.

Among the electrode layers 40, at least one layer from the lowermost layer may configure a source select line, and at least one layer from the uppermost layer may configure a drain select line. The electrode layers 40 between the source select line and the drain select line may configure word lines. The electrode layers 40 may include a conductive material.

For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may include silicon oxide.

The vertical channels CH may be coupled to the second substrate 11 through the electrode layers 40 and the interlayer dielectric layers 42. Each of the vertical channels CH may include a channel layer 50 and a gate dielectric layer 52. The channel layer 50 may include polysilicon or monocrystalline silicon, and may include a P-type impurity such as boron (B) in some regions thereof. The gate dielectric layer 52 may include a tunnel dielectric layer, a charge storage layer and a blocking layer, which are sequentially stacked from the outer sidewall of the channel layer 50. In some embodiments, the gate dielectric layer 52 may have an ONO (oxide-nitride-oxide) stack structure in which an oxide layer, a nitride layer and an oxide layer are sequentially stacked. Source select transistors, memory cells and drain select transistors may be configured in areas or regions in which the electrode layers 40 surround the vertical channels CH.

Bit lines BL may be defined over the electrode layers 40 and the interlayer dielectric layers 42 that are alternately stacked. Bit line contacts BLC may be defined under the bit lines BL to couple the vertical channels CH and the bit lines BL. The bit lines BL may extend in the second direction SD, and may be disposed in the first direction FD.

A wiring line W3 may be disposed over each bit line BL. A contact CNT3 may be defined under the wiring line W3 to couple the wiring line W3 and the bit line BL. The wiring line W3 may be coupled to the wiring line W2 of the logic structure LS through a contact CNT4. As a result, electrical paths are configured that couple the bit lines BL and the page buffer circuit of the logic structure LS.

Figure 13:
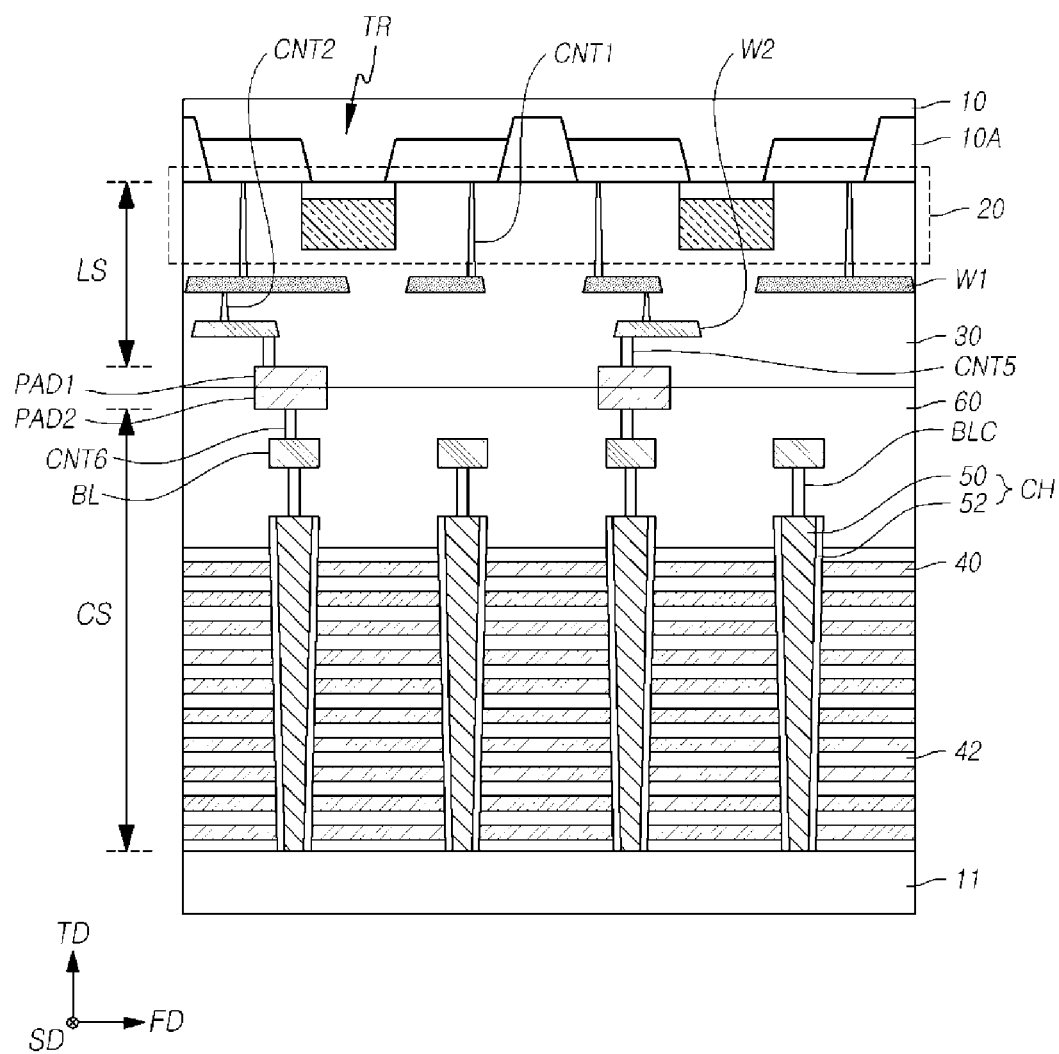

FIG. 13 is a cross-sectional view illustrating an example of a semiconductor memory device in accordance with an embodiment of the disclosure.

Referring to FIG. 13, a semiconductor memory device may have components substantially similar to those described above and with reference to FIG. 12, but as illustrated the semiconductor memory device may have a POC (peri over cell) structure. In other words, a logic structure LS may be disposed over a memory structure CS.

The memory structure CS and the logic structure LS may be fabricated on different substrates, and then, may be bonded and coupled together. For example, the memory structure CS may be fabricated on a second substrate 11 and the logic structure LS may be fabricated on a first substrate 10. The first substrate 10 and the second substrate 11 may be made of the same material. Each of the first substrate 10 and the second substrate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

First pads PAD1 may be defined on one surface of the logic structure LS. The first pads PAD1 may be coupled to a logic circuit 20 through wiring lines W1 and W2 and contacts CNT1, CNT2 and CNT5. The wiring lines W1 may include the wiring lines described above with reference to FIGS. 6 to 9. Second pads PAD2 may be defined on one surface of the memory structure CS. The second pads PAD2 may be coupled to bit lines BL through contacts CNT6.

As the one surface of the logic structure LS and the one surface of the memory structure CS are bonded to each other, the first pads PAD1 of the logic structure LS and the second pads PAD2 of the memory structure CS may be coupled with each other. Accordingly, electrical paths that couple the memory cells of the memory structure CS and the logic circuit 20 of the logic structure LS may be configured.

Figure 14:
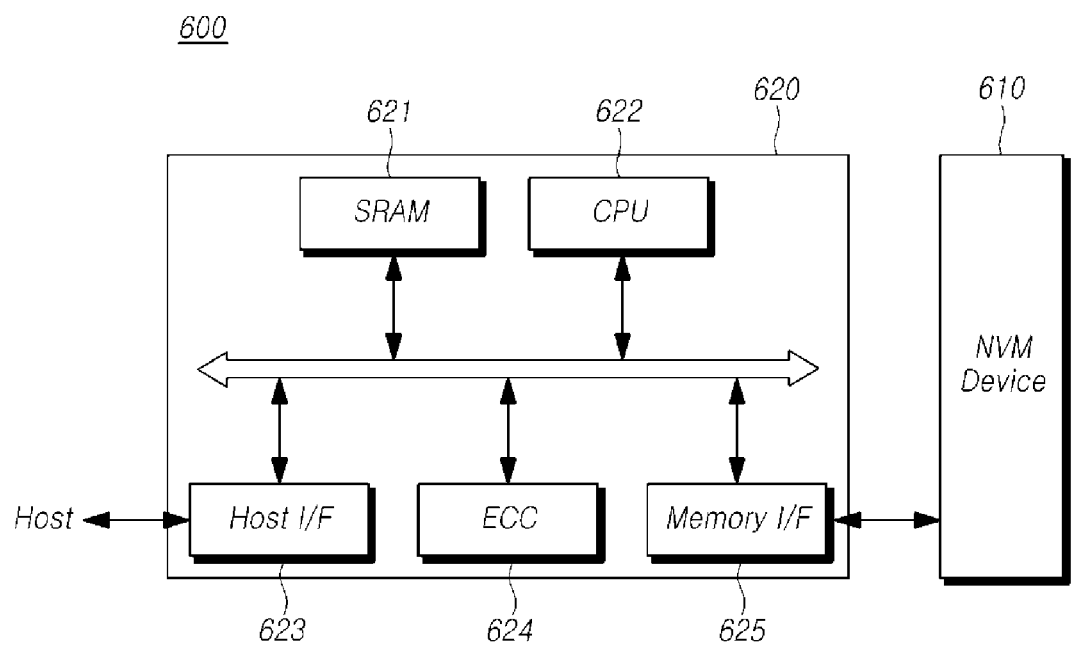
FIG. 14 is a block diagram schematically illustrating a representation of a memory system including a semiconductor memory device in accordance with an embodiment of the disclosure.

FIG. 14 is a block diagram schematically illustrating an example of a memory system including a semiconductor memory device in accordance with an embodiment of the disclosure.

Referring to FIG. 14, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 15:
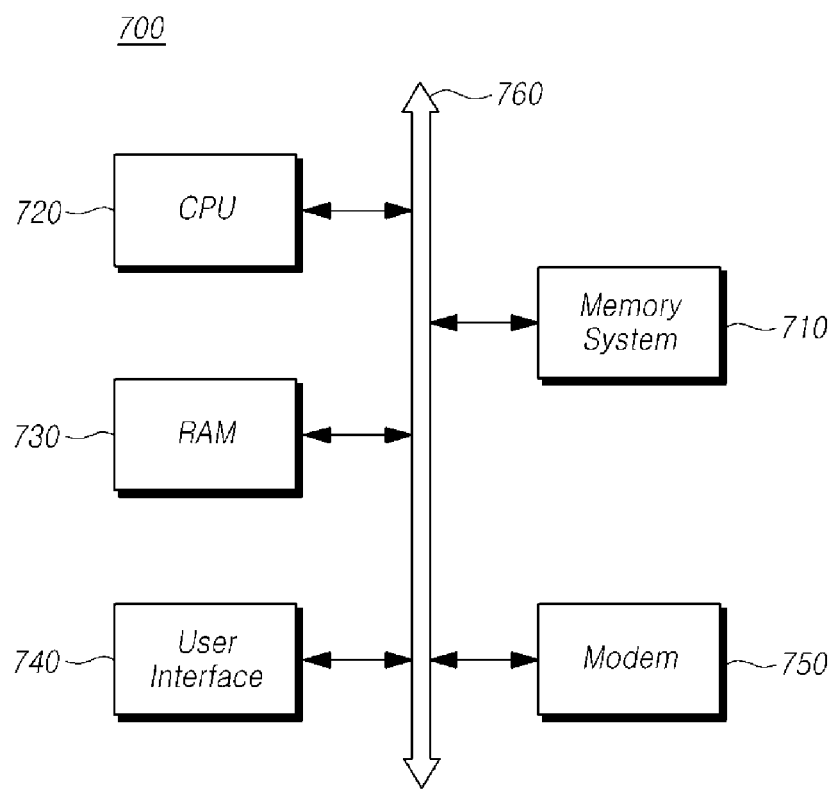
FIG. 15 is a block diagram schematically illustrating a representation of a computing system including a semiconductor memory device in accordance with an embodiment of the disclosure.

FIG. 15 is a block diagram schematically illustrating a computing system including a semiconductor memory device in accordance with an embodiment of the disclosure.

Referring to FIG. 15, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
    a plurality of page buffers defined in a plurality of active regions of a substrate; and
    a plurality of wiring lines disposed over the plurality of page buffers, and coupled to the plurality of page buffers through a plurality of contacts,
    wherein the plurality of wiring lines include a plurality of contact portions that are coupled to the plurality of contacts, and are bent such that the plurality of contact portions are offset toward center lines of the plurality of active regions.

2. The semiconductor memory device according to claim 1, wherein
    the plurality of page buffers are arranged in a second direction intersecting with a first direction,
    the plurality of wiring lines are arranged in the second direction, and
    the plurality of contact portions are offset in the second direction.

3. The semiconductor memory device according to claim 2, wherein each of the plurality of wiring lines includes at least two straight portions that extend in the first direction, and a tilted portion that connects the at least two straight portions with each other, and
    wherein, one of the plurality of contact portions is included in one of the at least two straight portions, which is offset toward the center line of the active region in the second direction with respect to the other of the at least two straight portions.

4. The semiconductor memory device according to claim 3, wherein a pitch of a plurality of tilted portions of the plurality of wiring lines is smaller than a pitch of a plurality of straight portions of the plurality of wiring lines.

5. The semiconductor memory device according to claim 3, wherein a width of one of the plurality of tilted portions in the second direction is smaller than a width of one of the at least two the straight portions.

6. The semiconductor memory device according to claim 3, wherein the plurality of tilted portions are lines extending at an oblique angle with respect to the straight portion.

7. The semiconductor memory device according to claim 3, wherein the plurality of tilted portions each has a stepped structure in which at least two lines extending at an oblique angle with respect to the straight portion are connected by a straight line connector extending the first direction.

8. The semiconductor memory device according to claim 2, wherein
    each of the page buffers includes a latch circuit having a non-inverting node that stores and retains non-inverted data and an inverting node that stores and retains inverted data,
    the wiring lines include non-inverting data lines that are coupled to non-inverting nodes of latch circuits of the page buffers and inverting data lines that are coupled to inverting nodes of the latch circuits of the page buffers, and
    the non-inverting data lines and the inverting data lines are alternately disposed in the second direction.

9. A semiconductor memory device comprising:
    a plurality of transistors defined in active regions of a substrate, and configuring a plurality of page buffers; and
    a plurality of wiring lines disposed over the plurality of transistors, and coupled to the plurality of transistors through a plurality of contacts,
    wherein each of the plurality of wiring lines includes at least two straight portions and a tilted portion that connects the straight portions, straight portions of adjacent wiring lines are spaced apart from each other with a first interval, and tilted portions of adjacent wiring lines are spaced apart from each other with a second interval smaller than the first interval, and
    wherein each of the plurality of contacts is coupled to one of the at least two straight portions of each of the plurality of wiring lines, and the straight portion that is coupled to the contact is disposed closer to a center line of each active region than the other straight portion that is not coupled with the contact.

10. The semiconductor memory device according to claim 9, wherein
    the plurality of page buffers are arranged in a second direction intersecting with a first direction, and
    the plurality of wiring lines are arranged in the second direction.

11. The semiconductor memory device according to claim 10, wherein, the straight portion that is coupled with the contact is offset toward the center line of the active region in the second direction with respect to the other straight portion which is not coupled with the contact.

12. The semiconductor memory device according to claim 10, wherein a pitch of tilted portions of the plurality of wiring lines in the second direction is smaller than a pitch of straight portions of the plurality of wiring lines in the second direction.

13. The semiconductor memory device according to claim 10, wherein a width of a tilted portion in the second direction is smaller than a width of a straight portion in the second direction.

14. The semiconductor memory device according to claim 10, wherein the tilted portion is a line that extends in an oblique angle with respect to a straight portion.

15. The semiconductor memory device according to claim 10, wherein the tilted portion has a stepped structure in which at least two lines extending in an oblique angle with respect to the at least two straight portions are connected by a straight line connector extending in the first direction.

16. A semiconductor memory device comprising:
    a memory structure including a memory cell array that is defined on a first substrate; and a logic structure including a logic circuit that is defined on a second substrate,
the logic circuit comprising:
a plurality of page buffers defined in active regions of the second substrate; and
a plurality of wiring lines disposed over the plurality of page buffers, and coupled to the plurality of page buffers through a plurality of contacts,
wherein each of the plurality of wiring lines includes contact portions that are coupled with the plurality of contacts, and the plurality of wiring lines are bent such that the contact portions are offset toward center lines of the active regions.

17. The semiconductor memory device according to claim 16, wherein the first substrate is disposed over the logic structure.

18. The semiconductor memory device according to claim 16, wherein
the memory structure includes a plurality of first pads, which are coupled to the memory cell array, on one surface thereof,
the logic structure includes a plurality of second pads, which are coupled to the logic circuit, on one surface thereof, and
the one surface of the logic structure is bonded onto the one surface of the memory structure, and the first pads and the second pads are coupled with each other.

19. The semiconductor memory device according to claim 16, wherein
the plurality of page buffers are arranged in a second direction intersecting with a first direction,
the plurality of wiring lines are arranged in the second direction, and
the contact portions are offset in the second direction.

20. The semiconductor memory device according to claim 19, wherein
each of the plurality of wiring lines includes at least two straight portions which extend in the first direction and a tilted portion which connects the straight portions with each other,
the contact portion is configured by one of the at least two straight portions, and
the straight portion coupled to the contact is offset toward the center line of the active region in the second direction and the other straight portion is not.

\* \* \* \* \*